United States Patent [19]
Reddy et al.

[11] Patent Number: 6,025,214
[45] Date of Patent: Feb. 15, 2000

[54] FUSIBLE LINK STRUCTURE FOR SEMICONDUCTOR DEVICES

[75] Inventors: Chitranjan N. Reddy, Los Altos Hills; Ajit K. Medhekar, San Jose, both of Calif.

[73] Assignee: Alliance Semiconductor Corporation, Santa Clara, Calif.

[21] Appl. No.: 08/956,192

[22] Filed: Oct. 22, 1997

Related U.S. Application Data

[62] Division of application No. 08/494,890, Jun. 26, 1995, Pat. No. 5,747,868.

[51] Int. Cl.[7] ................................................. H01L 21/82
[52] U.S. Cl. ............................................ 438/132; 438/467
[58] Field of Search ...................................... 438/132, 467

[56] References Cited

U.S. PATENT DOCUMENTS

| | | | |
|---|---|---|---|
| 4,476,375 | 10/1984 | Ogawa | 257/529 |
| 4,628,590 | 12/1986 | Udo et al. | 257/529 |
| 4,912,066 | 3/1990 | Wills . | |
| 5,235,205 | 8/1993 | Lippitt, III | 257/529 |
| 5,585,662 | 12/1996 | Ogawa | 257/529 |
| 5,821,160 | 10/1998 | Rodrigues et al. . | |

*Primary Examiner*—John F. Niebling
*Assistant Examiner*—Jonathan Hack

[57] ABSTRACT

An improved laser fusible link structure for semiconductor devices (200) and method of manufacturing thereof (10) is disclosed. A first conductive layer is patterned to create a laser fuse (202) and then covered with a first dielectric layer (212). An etch mask layer, in the preferred embodiment a second layer of polysilicon, is deposited and patterned to form a fuse etch mask (214) directly over the laser fuse (202). The fuse etch mask (214) has a width that is smaller than a minimum laser spot size, but large enough to protect the laser fuse (202) from fuse window over-etch, taking into account any potential misalignment between the laser fuse (202) and the fuse etch mask (214).

3 Claims, 5 Drawing Sheets

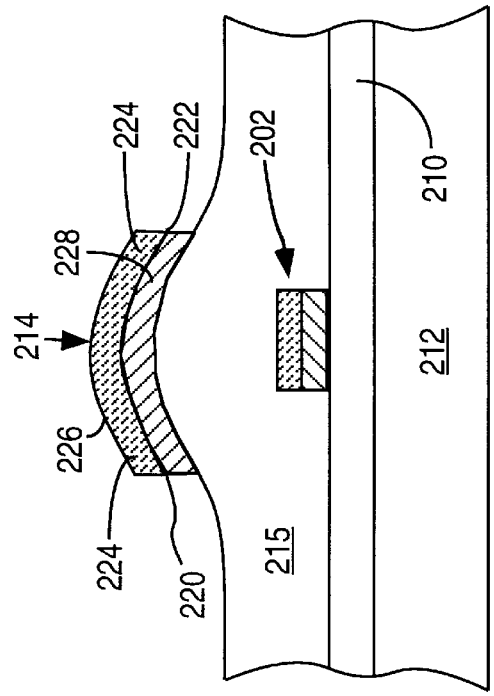
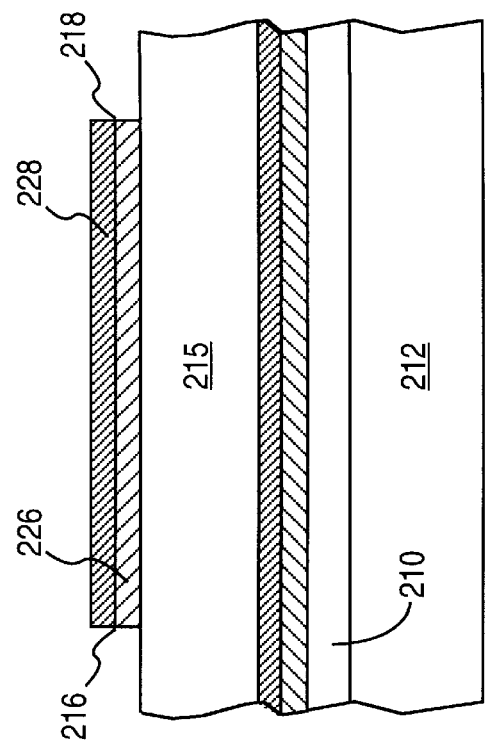
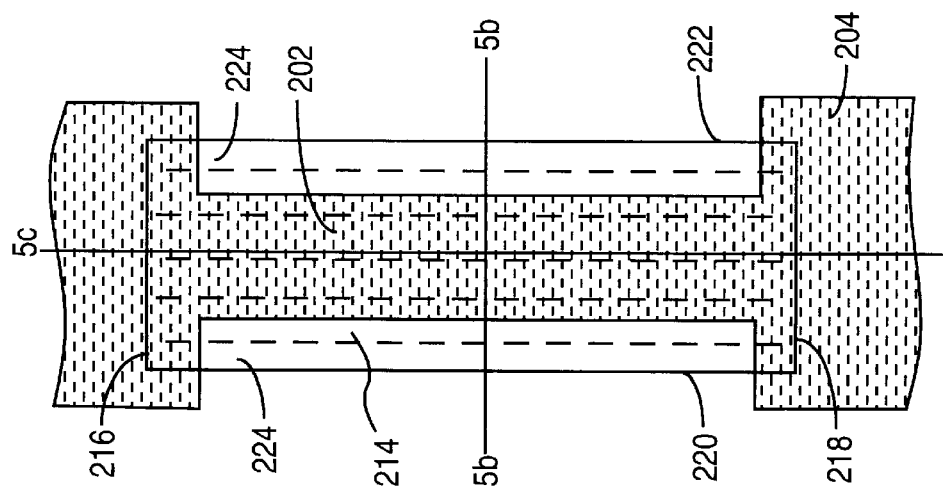

FUSIBLE LINK STRUCTURE FOR SEMICONDUCTOR DEVICES

This application is a division of application Ser. No. 08/494,890 filed Jun. 26, 1995 which application is now, U.S. Pat. No. 5,747,868.

TECHNICAL FIELD

The present invention relates generally to semiconductor devices, and more particularly to laser fusible links in semiconductor devices.

BACKGROUND OF THE INVENTION

A semiconductor device "laser fuse" or "laser fusible link" is a portion of a conductive layer, in many cases polysilicon, that is opened by the application of a laser. Laser fuses provide an effective way to alter the operation of a semiconductor device after it has been fabricated. One such alteration includes implementing redundancy schemes to replace defective portions of a integrated circuit with redundant portions (often referred to as "laser repair").

An important consideration in the fabrication of devices employing laser fuses is the thickness of the dielectric covering the fuse. When opening a laser fuse, the laser is applied, a portion of the laser fuse is vaporized, and the dielectric breaks open, allowing the vaporized laser fuse material to escape. In the event dielectric is too thick, the dielectric will not break open, and the vaporized material will not escape. Consequently, the laser fuse will remain electrically conductive. Because polysilicon is typically used as an initial layer of interconnect, for devices using polysilicon as the fuse material, two or more dielectric layers are subsequently deposited over the laser fuse resulting in an unacceptably high overall dielectric thickness. To reduce the amount of dielectric over the fuse it is known in the prior art to etch "fuse windows" into the dielectric layers covering the fuse. In order to reduce the number of fabrication steps required to manufacture the device, it is also known in the prior art to etch both fuse windows and "bond pad windows" in the same step. Bond pad windows are windows that are etched into the dielectric to expose the device bond pads. As is well known, the bond pads enable wire bonding between the device and a device package.

A potential drawback to simultaneous bond pad window and fuse window etching is the potential for fuse window over-etch. Referring now to FIG. 1a and 1b, an example of fuse window over-etch is illustrated. FIGS. 1a and 1b set forth a side cross sectional view of portions of a semiconductor device 10 that utilizes two layers of polysilicon and one layer of metal. FIG. 1a illustrates the device 10 prior to fuse window etch. The device is shown to include a laser fuse 12 composed of polysilicon 14 with a layer of silicide 16 formed thereon. The laser fuse 12 is fabricated on thermally grown field oxide 18, and covered with first dielectric layer 20. A second layer of polysilicon (not shown) is deposited and patterned on the first dielectric layer 20. A second dielectric layer 22 is then deposited. A metallization layer is deposited and patterned on the second dielectric layer 22. In FIGS. 1a and 1b, the metallization layer includes the bond pads of the semiconductor device. A portion of a bond pad 24 is shown situated on the second dielectric layer 22. A passivation layer 26 is deposited over the previous layers.

FIG. 1b illustrates the device 10 after an etch step that has resulted in fuse window over-etch. As shown in the figure, a bond pad window 28 has been etched through the passivation layer 26 to expose the bond pad 24. At the same time, a fuse window 30 has been etched over the laser fuse 12. The resulting fuse window 30, however, is over-etched. Rather than reducing the thickness of the dielectric/passivation layers over the laser fuse 12, all of the overlying layers have been removed, exposing, and partially etching, the laser fuse 12.

Fuse window over-etch commonly arises when fuse windows and bond pad windows are created simultaneously. To eliminate the possibility of residual passivation remaining on the bond pads 24, which can result in high resistance wire bonds or wire bonds of insufficient strength, it is known to over-etch the pad windows. In the event the etch rate is higher than expected (an acid bath was recently changed or maintained at too high a concentration) or the thickness of the passivation or dielectric layers (20, 22 or 26) was insufficient (due to process variation), the laser fuse 12 can be exposed within the fuse window 30. The exposed laser fuse 12 can be etched and/or subject to oxidation, both of which can increase its resistance, degrading the overall performance of the semiconductor device.

To reduce fuse window over-etch it is known in the prior art to etch the bond pad windows and fuse windows in two different etch steps. This increases processing time and process complexity, however.

Another prior art method to eliminate fuse window over-etch is illustrated in FIGS. 2a and 2b. The method includes forming a number of laser fuses 12, depositing a first dielectric layer 20, and then forming a second layer polysilicon (poly2) strip 32 over the laser fuses 12. A second dielectric layer 22 and passivation layer 26 are deposited over the poly2 strip. A fuse window 30 is etched into the passivation layer 26 and the second dielectric layer 22. The poly2 strip 32 functions as an etch barrier, preventing the underlying first dielectric layer 20 from being etched. This method has potential drawbacks, however.

As shown best in the top view of FIG. 2a, a first laser fuse 12a and an adjacent second laser fuse 12b have been opened during laser repair. A portion of the poly2 strip 32 has also been vaporized. As is best shown in the cross section of FIG. 2b, while both laser fuses (12a and 12b) are open, the first laser fuse 12a is shorted to the poly2 strip 32 via a first short 34, and the second laser fuse 12b is shorted to the poly2 strip 32 via a second short 36. One skilled in the art would recognize that shorting can also occur across an opened laser fuse 12 via the poly2 strip 32. Thus, while providing adequate protection from fuse window over-etch, the use of a poly2 strip 32 can produce shorts across otherwise opened laser fuses 12.

It would be desirable to provide a laser fuse structure that protects the laser fuse from over-etch without the drawbacks of prior art methods.

SUMMARY OF THE INVENTION

It is an object of the present invention to provide a laser fuse structure that protects the laser fuse from fuse window over-etch.

It is another object of the present invention to provide a laser fuse structure that that protects the laser fuse from over-etch without creating the potential for a short condition across the laser fuses.

According to the present invention, a laser fuse is fabricated and covered with a first dielectric layer. A fuse etch mask is then formed over the laser fuse so as to be aligned above the laser fuse. During fuse window etch, the fuse etch mask prevents the etching of the portion of the first dielectric layer directly beneath it, protecting the underlying laser fuse from fuse window over-etch. The width of the fuse etch mask is less than or equal to the minimum laser spot size used to open the laser fuse to eliminate the possibility of any shorting via the fuse etch mask.

According to another aspect of the present invention, while being less in width than a minimum laser spot size, the fuse etch mask width is greater than the width of the laser fuse, to account for any misalignment between the laser fuse and fuse etch mask, as well as any undercutting of the first dielectric below the fuse etch mask, that can occur from fuse window etches that are not completely anisotropic.

According to another aspect of the present invention, the laser fuse is patterned from a first layer of polysilicon and the etch mask is patterned from a second layer of polysilicon.

An advantage of the present invention is that it provides a laser fuse structure wherein bond pad windows and fuse windows can be created simultaneously, without the risk of fuse window over-etch.

Other advantages and objects of the invention will become apparent in light of the following description thereof.

BRIEF DESCRIPTION OF THE DRAWINGS

FIG. 2b is a side cross sectional view taken along line 2b—2b of FIG. 2a.

FIGS. 4a–4c, 5a–5c and 6a–6c are a series of top plan views and side cross sectional views illustrating the method set forth in FIG. 3 and a laser fuse structure according to a preferred embodiment of the present invention.

DETAILED DESCRIPTION OF THE EMBODIMENTS

Figure 1A:
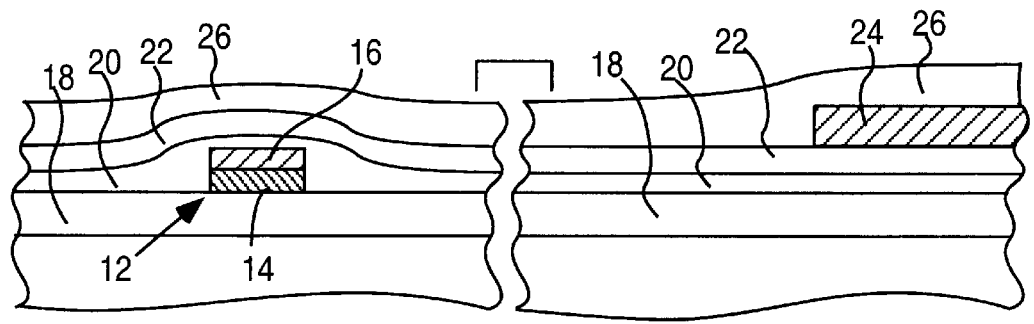
FIGS. 1a and 1b are side cross sectional views illustrating the fuse window over-etch problem.
Figure 1B:
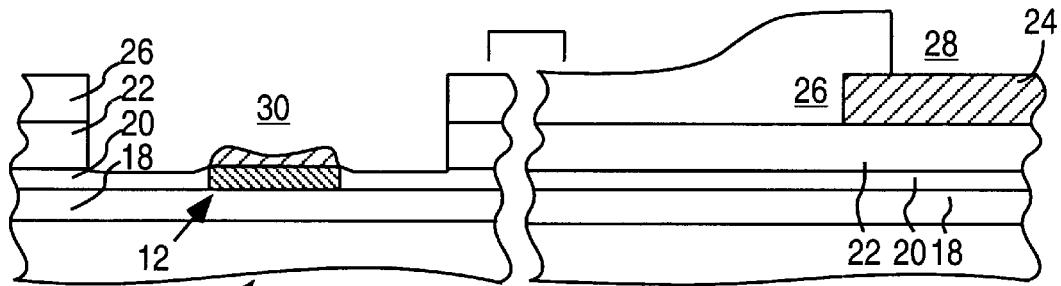
Figure 2A:
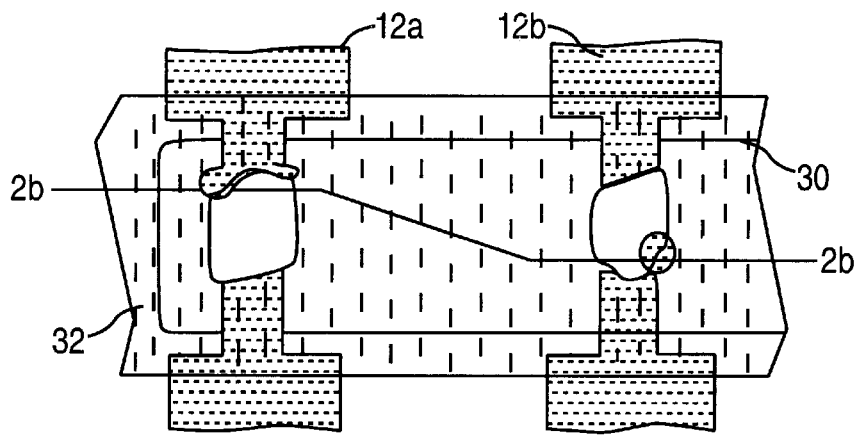
FIG. 2a is a top plan view illustrating a prior art method of addressing the fuse-window over etch problem.
Figure 2B:
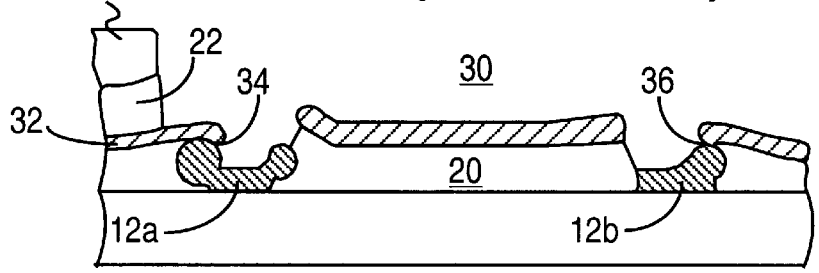
Figure 3:
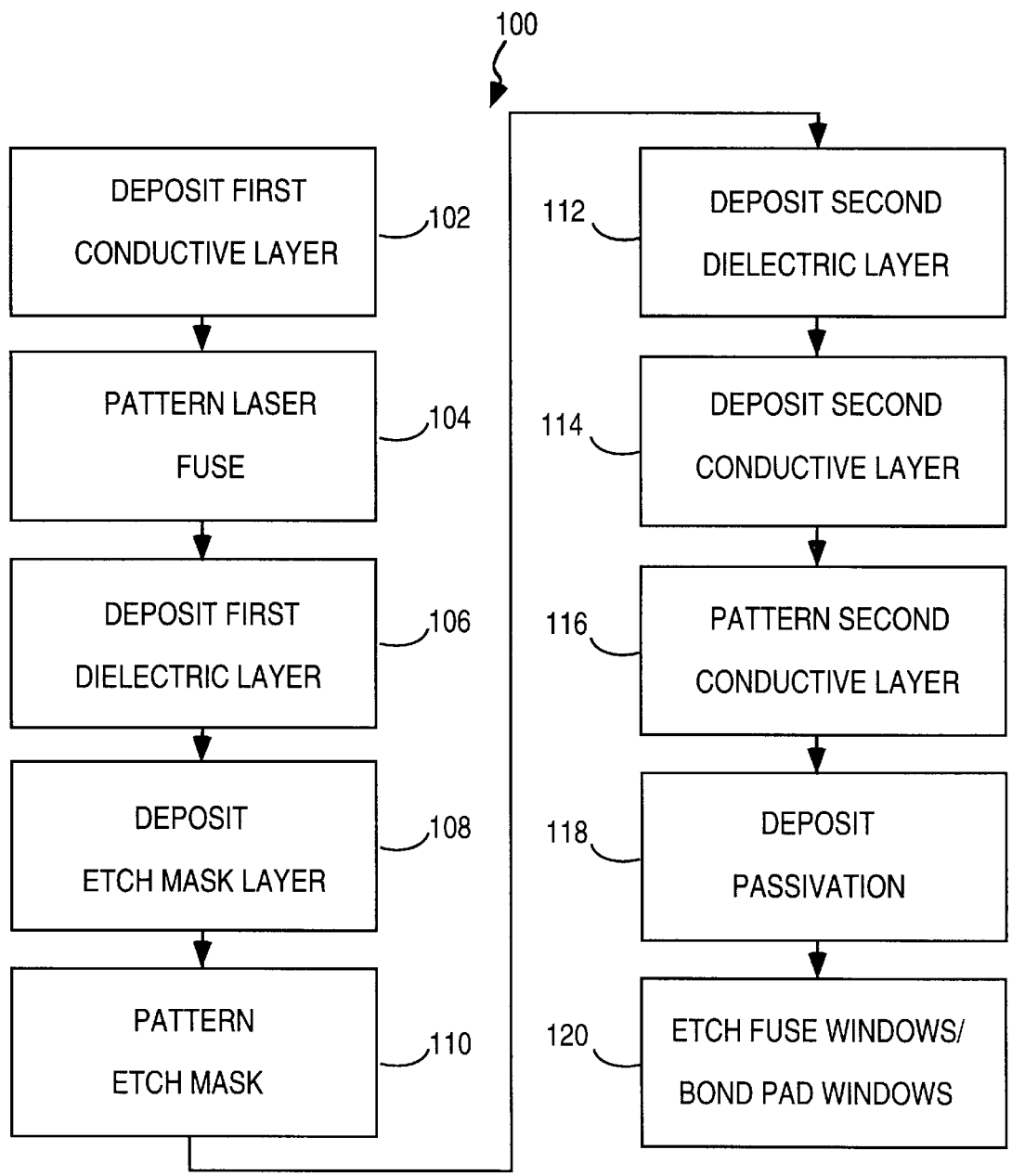
FIG. 3 is a flow chart illustrating a method of fabricating a laser fuse structure according to a preferred embodiment of the present invention.

FIG. 3 sets forth, generally, a method of fabricating a laser fuse structure according to a preferred embodiment of the present invention 100. According to a preferred embodiment 100, a first conductive layer is deposited (step 102), this layer is patterned to include at least one laser fuse (step 104), a first dielectric layer is deposited that covers the laser fuse (step 106), an etch mask layer is deposited on the first dielectric layer (step 108), the etch mask layer is patterned to form a fuse etch mask over each laser fuse (step 110), a second dielectric layer is deposited that covers the fuse etch mask (step 112), a second conductive layer is deposited on the second dielectric layer (step 114), the second conductive layer is patterned (step 116), a passivation layer is deposited over the conductive layer (step 118), and fuse windows (and bond pad windows) are etched through the passivation layer and the second dielectric layer, with the fuse etch mask protecting its associated laser fuse from over-etch (step 120).

The method of fabricating a laser fuse structure according to the preferred embodiment is best understood by referring to FIGS. 4–6 in conjunction with FIG. 3. FIGS. 4–6 illustrate a laser fuse structure 200 after various steps of process set forth in FIG. 3.

Figure 4B:
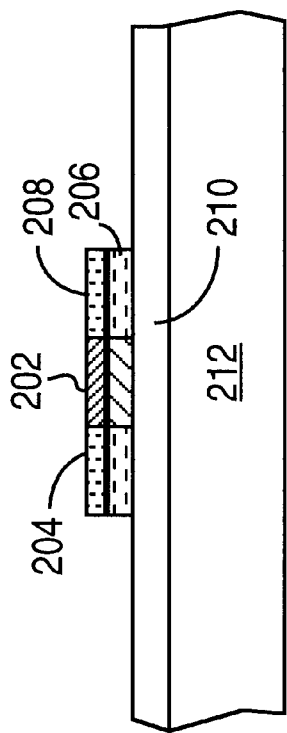
Figure 4C:
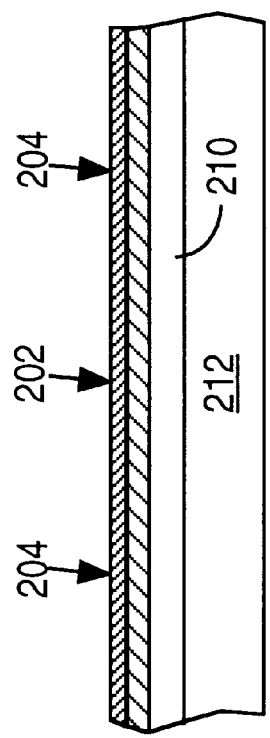
Figure 4A:
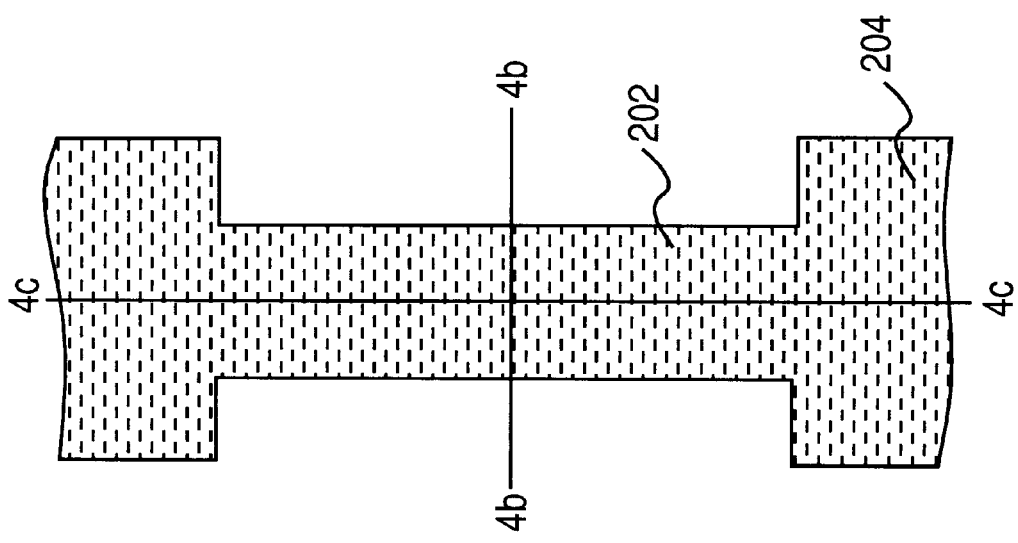

FIG. 4a is a top plan view illustrating a laser fuse 202 after the deposition (step 102) and patterning of the first conductive layer (step 104). In the preferred embodiment, the first conductive layer is a first layer of doped polysilicon (poly1). After the poly1 has been deposited, a layer of tungsten silicide (silicide) is formed over the polysilicon. Methods of depositing polysilicon and forming silicide are well known the in art and so will not be discussed any further herein.

The poly1-silicide layer is patterned (step 104) using photolithographic masking techniques in conjunction with reactive ion etching (RIE) to form at least one laser fuse 202. It is understood that that a first layer of conductive interconnect is simultaneously formed with the laser fuse 202. Referring once again to FIG. 4a, the laser fuse 202 is shown to be a narrow portion of a wider conductive line 204, and is generally rectangular, having a fuse length aligned along a first direction (shown by line 4c—4c), and a fuse width aligned along a second direction (shown by line 4b—4b).

Two side cross sectional views of the laser fuse 202 structure are shown in FIGS. 4b and 4c. FIG. 4b is taken along line 4b—4bof FIG. 4a, and FIG. 4c is taken along line 4c—4cof FIG. 4a. The laser fuse 202 of the preferred embodiment includes a layer of doped polysilicon 206, and a layer of tungsten silicide 208. According to well understood design principles, the laser fuse 202 is formed over field oxide 210 that has been thermally grown on a semiconductor substrate 212. In the preferred embodiment, the laser fuse 202 has a width of one micron (1 um), a polysilicon thickness of approximately 1,500 Å, and a silicide thickness of approximately 1,000 Å. One skilled in art would recognize that the rectangular shape of the fuse, and particular fuse material of the preferred embodiment should not be construed as limiting the invention thereto.

A first dielectric is deposited (step 106) over the patterned poly1, including the laser fuse 202. In the preferred embodiment the first dielectric is borophososilicate glass (BPSG) and has a thickness of approximately 8,000 Å. One skilled in the art would recognize that a contact etch would follow the deposition of the first dielectric.

In the preferred embodiment, the deposition of the etch mask layer (step 108) includes depositing a second layer of polysilicon (poly2) and the formation of silicide thereon. It is understood that the poly2 is used to form both a fuse etch mask, as well as a second layer of interconnect. The etch mask layer is patterned (step 110) in a similar manner as the first conductive layer. Conventional photolithographic masking and RIE are employed. The resulting fuse etch mask structure is best understood with reference to FIGS. 5a–5c.

FIG. 5a is a top plan view illustrating a fuse etch mask 214 formed over the laser fuse 202 on top of a first dielectric layer 215. In the preferred embodiment the fuse etch mask 214 is generally rectangular having a mask length extending in the first direction (shown by line 5c—5c) and a mask width extending in the second direction (shown by line 5b—5b). The fuse etch mask 214 is defined by a first mask end 216, an opposing second mask end 218, a first mask side 220 and an opposing second mask side 222. The mask length is distance between the mask ends (216 and 218), and the mask width is the distance between the mask sides (220 and 222). The fuse etch mask 214 is directly aligned over the laser fuse 202.

An important aspect of the present invention is the parameters defining the fuse etch mask width. As is shown in FIG. 5a, the fuse etch mask width is greater than the fuse width, having projecting portions 224 that project beyond the width of the laser fuse 202. Referring now to FIG. 5b and 5c, it is understood that while the fuse etch mask 214 itself provides protection against a vertical etch component of a fuse window etch, the mask projecting portion 224 provides increased protection from any lateral etch component that would undercut the fuse etch mask 214 and encroach on the laser fuse 202 from the sides. It is also understood that the width of the fuse etch mask 214 should be sufficient to account for any misalignment between the poly1 and poly2 layers. Accordingly, when a wet chemical etch (or another etch having a lateral etch component) is used to create the fuse window, a maximum lateral etch distance and poly1-poly2 misalignment are considered when determining fuse etch mask width. When RIE (or another anisotropic etch) is used to create the fuse window, only poly1-poly2 misalignment is considered. At the same time the fuse etch mask 214 is sufficiently wide to protect the laser fuse 202 from over-etch, in the preferred embodiment, the fuse etch mask width is less than the spot size of the laser utilized to open the laser fuse 202. This ensures the simultaneous vaporization of a section of the fuse etch mask 214 and the laser fuse 202, eliminating the possibility of shorting across the opened laser fuse 202 via the fuse etch mask 214. Referring once again to FIG. 5*b*, the fuse etch mask is shown to include a second polysilicon layer 226 and a second silicide layer 228. The fuse etch mask could also be composed of only one layer of polysilicon. In the preferred embodiment, the laser spot size is three microns (3 um) and the fuse etch mask width is 2.6 um. It is understood that the rectangular shape of the fuse etch mask 214 should not be considered limiting.

Referring back to FIG. 5*a*, the fuse etch mask 214 of the preferred embodiment is shown to have a greater length than the laser fuse 202 length. Consequently, the first and second mask ends (216 and 218) are situated over the conductive line portions 204. This should not be construed as limiting. As will be discussed below, in the preferred embodiment, the minimum fuse etch mask length is dictated by the dimensions of its associated fuse window.

Once the fuse etch mask 214 is formed (along with the poly2 interconnect pattern), a second dielectric is deposited (step 112). In the preferred embodiment the second dielectric layer is composed of a layer of undoped silicon dioxide and a layer of BPSG deposited by conventional means, and is followed by a contact etch step. A second conductive layer (not shown in FIGS. 4–6) is deposited over the second dielectric layer (step 114) and then patterned (step 116). In the preferred embodiment the second conductive layer is composed of aluminum, and when patterned, includes a plurality of bond pads. The deposition and patterning of the aluminum is conventional in nature.

A passivation layer is deposited over the patterned aluminum (step 118). In the preferred embodiment the passivation layer is a two layer structure of undoped silicon dioxide with a layer silicon nitride thereon. Fuse windows and bond pad windows are etched (step 120) in a single etch step (commonly referred to as "pad etch").

Figure 6B:
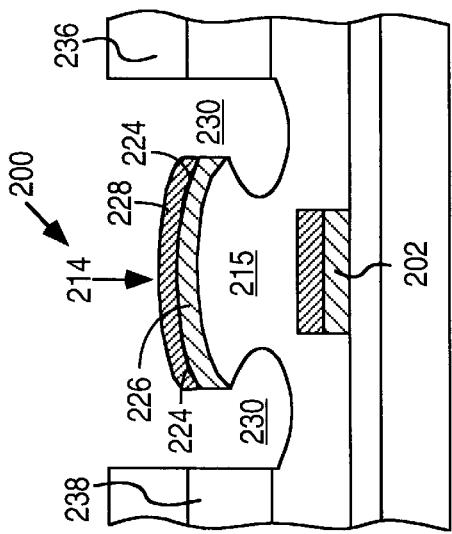
Figure 6C:
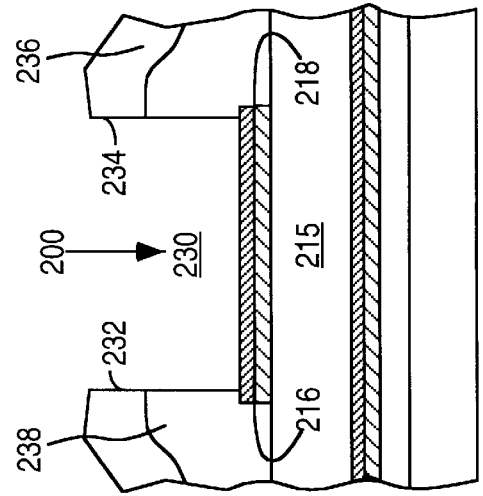
Figure 6A:
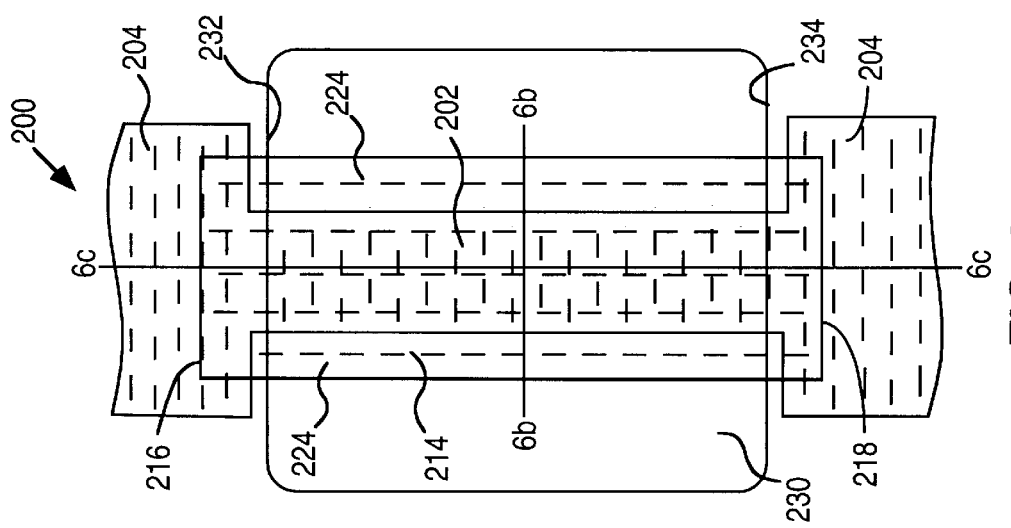

The laser fuse structure 200 of the preferred embodiment following step 120 is set forth in FIGS. 6*a*–6*c*. FIG. 6*a* is a top plan view illustrating the laser fuse 202, fuse etch mask 214, and a fuse window 230. The fuse window 230 has a window length that extends in the first direction (shown by line 6*c*—6*c*). The window length is defined by the distance between a first window end 232 and an opposing second window end 234. FIGS. 6*b* and 6*c* are side cross sectional views taken along lines 6*b*—6*b* and 6*c*—6*c*, respectively, of FIG. 6*a*. As is best shown in FIGS. 6*b* and 6*c*, the fuse window 230 is formed by etching through the passivation layer 236 and the second dielectric layer 238.

FIG. 6*b* illustrates how fuse window over-etch is prevented by the present invention. While the fuse etch mask 214 prevents the removal of that portion of the first dielectric layer 215 that is directly over the laser fuse 202, some undercutting of the first dielectric layer 215 occurs below the fuse etch mask projecting portions 224. However, as was mentioned previously above, the fuse etch mask 214 is sufficiently wide to prevent the undercutting action of the etch from reaching the laser fuse 202. It is understood that while the fuse window 230 illustrated in FIGS. 6*a*–6*c* has a generally rectangular shape, the fuse window may be fabricated in a variety of shapes, being defined by a window perimeter, two portions of which function as fuse window ends.

Referring now to FIGS. 6*a* and 6*c* it is shown that the fuse window length is less than fuse etch mask length. As a result, the mask ends (216 and 218) extend beyond the window ends (232 and 234). This arrangement ensures that portions of the laser fuse 202 (or its associated conductive line 204) extending beyond the mask ends (216 and 218) are not subject to over-etch. In the preferred embodiment, the maximum possible misalignment between the fuse window 230 and the laser fuse 202 is taken in consideration in determining the length of the fuse etch mask 214.

As will be apparent to one skilled in the art, the invention has been described in connection with its preferred embodiments, and may be changed, and other embodiments derived, without departing from the spirit and scope of the invention. Accordingly, the above disclosure is not intended to be limiting and the appended claims are to be interpreted as encompassing the entire scope of the invention.

What we claim is:

1. In a semiconductor device, a method of fabricating an improved laser fusible link, comprising the steps of:
    (a) depositing a first conductive layer;
    (b) patterning said first conductive layer to form at least one fusible link, said fusible link having a link width extending in a substantially first direction;
    (c) depositing a first dielectric layer;
    (d) depositing an etch mask layer over said first dielectric layer;
    (e) patterning said etch mask layer to form at least one etch mask aligned with, and situated over, each said fusible link, each said etch mask having a mask width extending in the substantially first direction, the mask width being greater than the fusible link width, said patterning step includes determining a maximum misalignment (W) between the etch mask and the fusible link in the first direction and patterning the etch mask so that the mask width is at least equal to the link width plus 2W;
    (f) depositing a second dielectric layer; and
    (g) anisotropically etching said second dielectric layer to form at least one fuse window having opposing window sides, the fuse window being disposed over said etch mask and its associated fusible link, with the etch mask extending in the first direction beyond the opposing window sides.

2. In a semiconductor device, a method of fabricating an improved laser fusible link, comprising the steps of:
    (a) depositing a first conductive layer;
    (b) patterning said first conductive layer to form at least one fusible link, said fusible link having a link width extending in a substantially first direction;
    (c) depositing a first dielectric layer;
    (d) depositing an etch mask layer over said first dielectric layer;

(e) patterning said etch mask layer to form at least one etch mask aligned with, and situated over, each said fusible link, each said etch mask having a mask width extending in the substantially first direction, the mask width being greater than the fusible link width, said patterning step includes determining a maximum fuse window etch lateral undercut distance (d) and patterning said etch mask so that the mask width is at least equal to the link width plus 2d;

(f) depositing a second dielectric layer; and (g) etching said second dielectric layer to form at least one fuse window having opposing window sides, the fuse window being disposed over said etch mask and its associated fusible link, with the etch mask extending in the first direction beyond the opposing window sides said etch step includes using an etch that includes a lateral etch component.

3. In a semiconductor device, a method of fabricating an improved laser fusible link, comprising the steps of:

(a) depositing a first conductive layer;

(b) patterning said first conductive layer to form at least one fusible link, said fusible link having a link width extending in a substantially first direction;

(c) depositing a first dielectric layer;

(d) depositing an etch mask layer over said first dielectric layer;

(e) patterning said etch mask layer to form at least one etch mask aligned with, and situated over, each said fusible link, each said etch mask having a mask width extending in the substantially first direction, the mask width being greater than the fusible link width, said patterning step includes determining a maximum misalignment (L) between said etch mask and the opposing window sides and patterning said etch mask so that the etch mask has a length that is at least equal to the distance between opposing window sides, plus 2L;

(f) depositing a second dielectric layer; and (g) etching said second dielectric layer to form at least one fuse window having opposing window sides, the fuse window being disposed over said etch mask and its associated fusible link, with the etch mask extending in the first direction beyond the opposing window sides.

* * * * *